United States Patent [19]
Miyata

[11] 3,967,309
[45] June 29, 1976

[54] SEMICONDUCTOR DEVICE WITH A SEMICONDUCTOR SUBSTRATE HAVING DIELECTRICALLY ISOLATED FUNCTIONAL REGIONS

[75] Inventor: Kenzi Miyata, Hitachi, Japan

[73] Assignee: Hitachi, Ltd., Japan

[22] Filed: Feb. 5, 1974

[21] Appl. No.: 439,702

[30] Foreign Application Priority Data
Feb. 7, 1973  Japan.................................. 48-14642

[52] U.S. Cl....................................... 357/49; 357/55; 357/59
[51] Int. Cl.².................. H01L 27/04; H01L 27/12; H01L 29/06
[58] Field of Search........................... 357/49, 59, 55

[56] References Cited
UNITED STATES PATENTS

| | | | |
|---|---|---|---|
| 3,381,182 | 4/1968 | Thornton | 357/49 |
| 3,411,200 | 11/1968 | Formigoni | 357/49 |
| 3,456,335 | 7/1969 | Hennings et al. | 357/49 |
| 3,624,463 | 11/1971 | Davidsohn | 357/49 |
| 3,624,467 | 11/1971 | Bean et al. | 357/49 |
| 3,813,584 | 5/1974 | Davidsohn et al. | 357/49 |

OTHER PUBLICATIONS
Doo, IBM Tech. Discl. Bull., vol. 8, No. 5, Oct. 1965, pp. 798–799.

*Primary Examiner*—William D. Larkins
*Attorney, Agent, or Firm*—Craig & Antonelli

[57] ABSTRACT

A dielectric insulating film is provided between adjacent monocrystalline semiconductor functional regions, or a dielectric insulating film is provided which extends from the non-exposed major surface of a monocrystalline semiconductor region to the exposed surface thereof to form therein a polycrystalline semiconductor region having a potential intermediate those of both the functional regions for improving the dielectric breakdown voltage and heat dissipation, and for a reduction in the parasitic capacitance.

14 Claims, 13 Drawing Figures

SEMICONDUCTOR DEVICE WITH A SEMICONDUCTOR SUBSTRATE HAVING DIELECTRICALLY ISOLATED FUNCTIONAL REGIONS

The present invention relates to a semiconductor device, and more particularly to a semiconductor device in which a plurality of functional regions provided in a semiconductor substrate so as to be exposed to one of the major surfaces are electrically isolated from each other upon the formation of integrated circuits.

In general, a semiconductor integrated circuit may be one of various types; a monolithic integrated circuit is one of the basic types and includes, in one semiconductor substrate, various kinds of circuit elements such as transistors, diodes, resistors, capacitors, or the like, so that these circuit elements may to be electrically isolated from each other.

At the present time, to provide isolation a backward-biased PN junction or a dielectric insulating film such as silicon oxide may be used. The latter has advantages over the former such as a small parasitic capacitance between functional regions in which the circuit elements are provided, a high dielectric breakdown voltage with high voltage isolation, and a negligible parasitic transistor effect, while also having the drawbacks described below.

An object of the present invention is to provide a semiconductor device in a semiconductor substrate capable of maintaining a predetermined dielectric breakdown voltage through a thin dielectric insulating film which is free from the generation of cracks resulting from differences in the thermal expansion coefficients.

Another object of the present invention is to provide a semiconductor device in a semiconductor substrate having a small parasitic capacitance between monocrystalline semiconductor regions.

A further object of the present invention is to provide a semiconductor device in a semiconductor substrate capable of attaining improved heat dissipation as well as an increase in the dielectric breakdown voltage and a reduction in the parasitic capacitance.

According to the present invention, a semiconductor substrate includes a polycrystalline semiconductor region to which a plurality of monocrystalline semiconductor regions are, respectively, fixed through a dielectric insulating film, one of the major surfaces of each monocrystalline semiconductor being exposed to one of the major surfaces of the polycrystalline semiconductor region in the same plane. A dielectric insulating film is provided between adjacent monocrystalline semiconductor regions over both the regions, or a dielectric insulating film is provided which extends from the non-exposed major surface of the monocrystalline semiconductor region to the exposed surface thereof to form therein a polycrystalline semiconductor region having a potential intermediate those of both the monocrystalline semiconductor regions.

Other objects and features of the present invention will be understood with ease by way of embodiments described in connection with the accompanying drawings, in which.

At first, description will be made of a semiconductor device according to the prior art which makes use of dielectric isolation.

Figure 1:
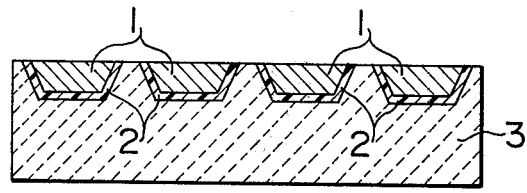
FIG. 1 is a longitudinal sectional view showing a dielectrically isolated semiconductor substrate in a conventional semiconductor device.

The structure of a semiconductor substrate having dielectric isolation is, as shown in FIG. 1, such that a plurality of monocrystalline semiconductor functional regions 1 are electrically isolated from each other by a dielectric insulating film 2 and fixed to a common polycrystalline semiconductor substrate 3, a desired impurity being diffused into the monocrystalline semiconductor regions 1 to form the above-mentioned circuit elements of various types.

In this arrangement, the dielectrically isolated monocrystalline semiconductor regions 1 are disposed on one major surface, and the dielectric breakdown voltage between the monocrystalline semiconductor regions depends upon the dielectric insulating film 2, the nature of which is an important factor in determining the dielectric breakdown voltage.

For the dielectric insulating film 2, silicon oxide $SiO_2$ is most commonly used, a doped oxide, a vitreous insulating film or the like may also be used. However, great attention must be paid to the selection of the dielectric insulating film, taking into consideration the fact that the impurities in the dielectric insulating film should not have any adverse influence on the monocrystalline region 1 serving as the functional region, and that a local defect such as a pin hole should be avoided.

An increase in the thickness of the dielectric insulating film 2 is required for a further improvement in the dielectric breakdown voltage. In this case, it is common that the thermal expansion coefficient of the dielectric insulating film 2 is different from those of an semiconductor regions 1 and 3. As a result, the increase in thickness to some degree leads to the generation of cracks in the dielectric insulating film 2, thus resulting in a loss of the insulating function. For example, in the use of silicon oxide, the allowable voltage applied to a film 1.0 micron thick is 100 volts at most, while the thickness for which no crack appears is less than 3 microns. Accordingly, it is concluded that the dielectric breakdown voltage between the monocrystalline semiconductor regions 1 has a limitation of 600 volts by reason of existence of the two silicon oxides and the dielectric breakdown voltage between the monocrystalline semiconductor region 1 and polycrystalline semiconductor region 3 has a limitation of 300 volts by reason of the presence of one silicon oxide film therebetween.

An advantage of dielectric isolation over PN junction isolation is the small parasitic capacitance between the monocrystalline semiconductor regions 1. The advantage is improved by an increase in the thickness of the dielectric insulating film 2 which is the same as for the above-mentioned dielectric breakdown voltage, but it is impossible to reduce the parasitic capacitance without any restriction because the generation of cracks prevents an increase in the thickness of the film to some extent as mentioned above.

For dielectric isolation, the intensity of an electric field in the dielectric insulating film 2 is generally about one order of magnitude higher than that generated in the PN junction which occurs when film is silicon oxide. Therefore, a device having functional (circuit) element of a high voltage is liable to have its dielectric breakdown voltage reduced after long use at the boundary between the monocrystalline semiconductor region 1 and the polycrystalline semiconductor region 3, particularly on the surface of the semiconductor substrate. This causes the useful life of the device to be shortened, and eventually causes the path between the monocrystalline semiconductor regions 1 to be short-circuited due to a discharge across air. It is further impossible to prevent the short-circuiting even in a case where a large interval is provided between the monocrystalline semiconductor regions 1. A practical solution therefor is that on the major exposed surface the monocrystalline semiconductor region 1 is coated with a protective coating to provide a structure capable of enduring a strong electric field. It is, however, impossible to reduce the electric field of the dielectric insulating film 2 in the proximity of its surface to such an extent, and impurities or ions usually contained in a protective surface coating have the similar adverse influence thereon even with the provision of the protective coating.

Further, it is an important dissipate heat which is developed in the monocrystalline semiconductor regions 1.

Most of the surface areas of the monocrystalline semiconductor region 1 come into contact with the polycrystalline semiconductor region 3 through the dielectric insulating film 2 with the expectation that the developed heat is dissipated thereto by conduction. The silicon oxide coating, however, has a thermal conductivity about one-tenth as small as that of the semiconductor material itself, so that the decrease of the dielectric insulating film 2 in thickness taking into consideration the thermal conduction of the polycrystalline semiconductor region 3 is incompatible with the increase in thickness intended for the improvement of the above-mentioned dielectric breakdown voltage and for a reduction of the parasitic capacitance.

The present invention is intended to provide a semiconductor device free from the above-mentioned drawbacks.

Figure 2A:
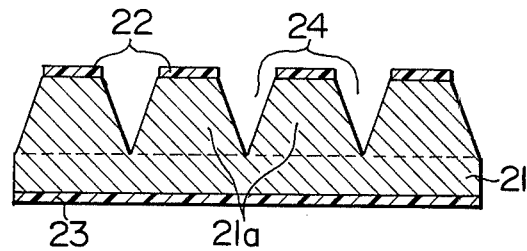
FIGS. 2a to 2e are longitudinal sectional views showing the structure and manufacturing steps of a dielectrically isolated semiconductor substrate in a semiconductor device according to the present invention.

Next, the semiconductor device according to the present invention will be described together with its manufacturing steps. As will be seen in FIG. 2a, the entire surface of one side of monocrystalline semiconductor wafer 21 is first provided with a material which is more etching-resistant than the wafer 21, that is, with a silicon oxide coating 22 in a case where the monocrystalline semiconductor wafer 21 is formed of silicon. The silicon oxide coating 22 at the portions at which isolation grooves are provided, as described below, is removed from the wafer 21 by a well known photoetching method. On the other hand, the other surface of the wafer is coated with an etching-resistant substance 23. By etching technique, an isolation groove 24 is provided in that portion of the monocrystalline semiconductor wafer 21 from which the silicon dioxide coating 22 is removed. The isolation grooves 24 are formed so as to provide at the monocrystalline semiconductor wafer 21 a substantially trapezoid portion 21 which is left due to the presence of the silicon oxide coating 22.

For example, the arrangement of the isolation grooves 24 in the form of a grid by etching techniques provides a monocrystalline semiconductor wafer 21 on which a plurality of trapezoid portions 21a having a square or rectangular land portion are left in columns and rows.

Figure 2B:
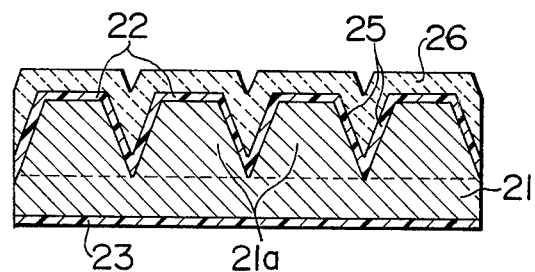

Next, as is shown in FIG. 2b, the isolation groove 24 of the monocrystalline semiconductor wafer 21 is covered at its inner surface with a silicon oxide coating 25 which becomes a dielectric insulating film for effecting electrical isolation of the monocrystalline semiconductor region by a thermal treatment method. A polycrystalline semiconductor layer 26 is then vapor-grown on the wafer.

Figure 2C:
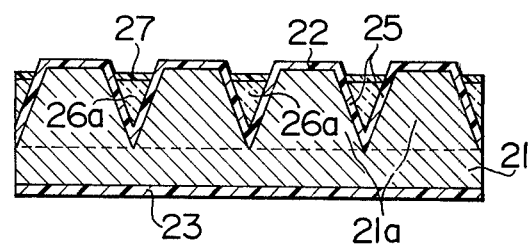

As is shown in FIG. 2c, the polycrystalline semiconductor layer 26 in the isolation groove 24 is then selectively retained on the wafer with the remainder of the layer 26 removed therefrom. In this case, the exposed surface of the retained polycrystalline semiconductor region 26a is formed so as to be disposed below the plane of the silicon oxide film 22. Then, the entire exposed surface of the retained polycrystalline semiconductor layer 26a is covered with a silicon oxide coating 27.

Figure 2D:
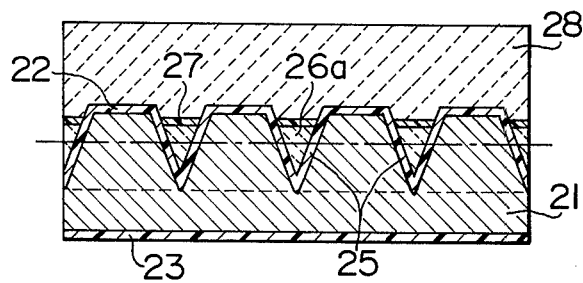

Next, a polycrystalline semiconductor layer 28, serving as a polycrystalline semiconductor substrate region, is vapor-grown on the silicon oxide coatings 22, 27, as is shown in FIG. 2d, in the same manner as in FIG. 2b. Then, the monocrystalline semiconductor wafer 21 is removed from the side of the silicon oxide coating 23 by a chemical and/or mechanical polishing method to the extent of a position reaching the silicon oxide coating 25 provided in the inner surface of the isolation groove 24, that is, the position of a dot-dash line shown in FIG. 2d. Thus, as is shown in FIG. 2e, a semiconductor substrate 29 is provided which has a plurality of dielectrically isolated monocrystalline semiconductor functional regions 21b.

Figure 2E:
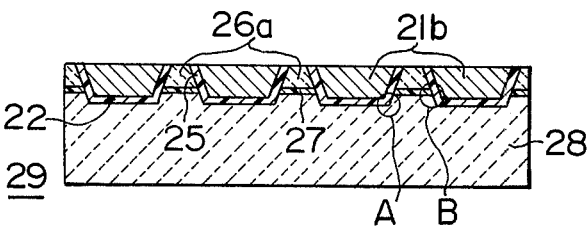

It to be noted that the substrate is shown in FIG. 2e is upside down relative to that shown in FIGS. 2a to 2d.

The semiconductor 29 thus prepared through the above manufacturing steps as shown in FIG. 2e has advantages as follows:

1. The polycrystalline semiconductor regions 26a provided between the adjacent monocrystalline semiconductor functional regions 21b in surrounding relation thereto are isolated from each other in an insulating manner by the polycrystalline semiconductor region 28 and the silicon oxide coatings 25, 27, and, hence, are electrically isolated from the polycrystalline semiconductor substrate region 28, i.e., floating with respect thereto. As a result, an intermediate potential is provided which is determined by the potential of the adjacent monocrystalline semiconductor regions 21b and that of the polycrystalline semiconductor region 28. For this reason, the potential gradient at the exposed surface of the silicon oxide coating disposed at the side surface of the monocrystalline semiconductor region 21b is weak to maintain a sufficient dielectric breakdown voltage in the thin silicon oxide coating 25 over the useful life of the lengthened device.

2. The decrease of the thickness of the silicon oxide coating 25 makes it possible to prevent cracks from being produced in the silicon oxide film 25 due to the differences of the thermal expansion coefficients.

3. The floating polycrystalline semiconductor regions 26a surround the monocrystalline semiconductor regions 21b at the side surface portions thereof and a single silicon oxide coating 22 is interposed between the bottom surface of the monocrystalline regions 21b and the surface of the polycrystalline region 28 supporting the monocrystalline semiconductor regions 21b thereon. Due to the floating polycrystalline regions 26a, the thickness of the silicon oxide coating 22 can be reduced in order to provide the same breakdown voltage requirement. Therefore, the rate of heat conduction can be improved and heat which is generated in the monocrystalline regions 21b can be efficiently dissipated into the polycrystalline region 28.

In the formation of the polycrystalline semi-conductor region 23 in the embodiment as shown in FIG. 2e, a strain is concentrated on the portion shown by a circle A, that is, on a circumferential portion of the non-exposed major surface on the other side of the monocrystalline semiconductor region 21b where the silicon oxide coatings 22 and 25 encounter each other, and on the portion shown by a circle B, that is, on the marginal portion of the monocrystalline semiconductor region 21b where the silicon oxide coatings 25 and 27 meet. This strain induces a stress in the monocrystalline semiconductor region 21b and sometimes causes an adverse influence such as a lattice defect on the electric characteristics of the monocrystalline semiconductor region 21b.

Figure 3:
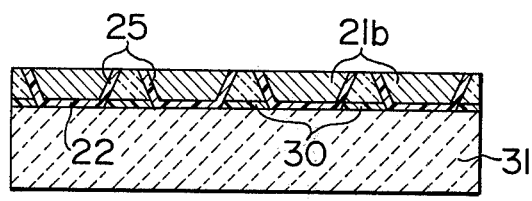
FIGS. 3 to 5 are longitudinal sectional views showing a modification of the semiconductor substrate in a semiconductor device according to the present invention.

In this respect, the planes of the polycrystalline semiconductor region 26a and the silicon oxide coating 27 formed in the steps of FIGS. 2b and 2c are coordinated with that of the silicon oxide coating 22, as shown in FIG. 3, to remove the appearance of the strain and the adverse influence imposed on the monocrystalline semiconductor region 21b.

The silicon oxide coating provided on the basis of the above teaching is shown by numeral 30.

This arrangement has the advantage from the viewpoint of manufacturing steps in that the adjustment of the thickness of the polycrystalline semiconductor layer 31 can be carried out with ease in the manufacturing step of FIG. 2d because the silicon oxide coatings 22 and 30 are disposed on the same plane.

Figure 4:
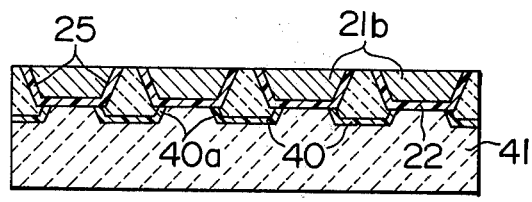

In the embodiment shown in FIG. 4, a silicon oxide coating 40 serving as an insulating dielectric film and provided over the adjacent monocrystalline semi-conductor regions 21b and a connection 40a to the silicon oxide coating 22, the connection 40a being disposed in the central direction of the monocrystalline semiconductor region 21b and extending therefrom towards the major surface on the other side of the polycrystalline semiconductor region 41.

Figure 5:
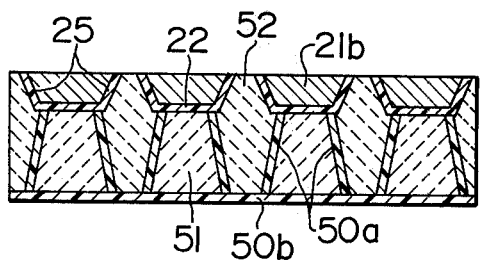

In the embodiment shown in FIG. 5, the polycrystalline semiconductor region 52 floating so as to be of intermediate potential further extends downwardly to the extent that it reaches the lower major surface of the polycrystalline semiconductor region 51, both the polycrystalline semiconductor regions 51 and 52 constituting a polycrystalline semiconductor substrate region.

In this embodiment, the silicon oxide coatings provided for forming the floating polycrystalline semiconductor region 52 are shown by numerals 50a and 50b.

In such an arrangement, the parasitic capacitance resulting from the dielectric silicon oxide coatings 50a, 50b is added in series to the parasitic capacitance between the adjacent monocrystalline semiconductor regions 21b resulting from the dielectric silicon oxide coating 22 with the result that the total parasitic capacitance between the adjacent monocrystalline semiconductor regions 21b is greatly reduced.

Figure 6:
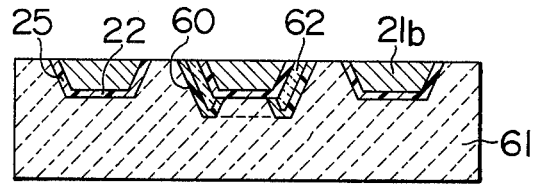
FIGS. 6 to 9 are longitudinal sectional views each showing a different embodiment of a dielectrically isolated semiconductor substrate in a semiconductor device according to the present invention.

In the embodiment of FIG. 6, a floating polycrystalline semiconductor region 62 electrically isolated from the polycrystalline semiconductor region 61 is provided between the adjacent monocrystalline semiconductor regions 21b. For that purpose, instead of providing the dielectric film between the adjacent monocrystalline semiconductor regions 21b, a dielectric insulating film 60 is provided therebetween which extends from the non-exposed major surface on the other side of the monocrystalline semiconductor region 21b to the exposed surface thereof so as to surround the circumferential side portion of the monocrystalline semiconductor region 21b.

Figure 7:
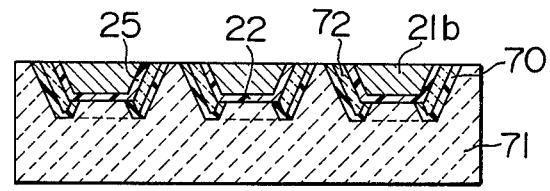

In the embodiment of FIG. 7, the embodiment of FIG. 6 is further developed: all the adjacent monocrystalline semiconductor regions 21b are surrounded by floating polycrystalline semiconductor regions 72 electrically isolated from polycrystalline semiconductor region 71 by a dielectric insulating film 70.

In this embodiment, the floating polycrystalline regions are increased in number as compared with the embodiment of FIG. 6. This further improves the performance of the dielectric breakdown voltage measured at the edge portion exposed toward the upper major surface of the dielectric insulating film 25 which surrounds the monocrystalline semiconductor region 21b, and thus reduces the parasitic capacitance between the adjacent monocrystalline semiconductor regions 21b.

Figure 8:
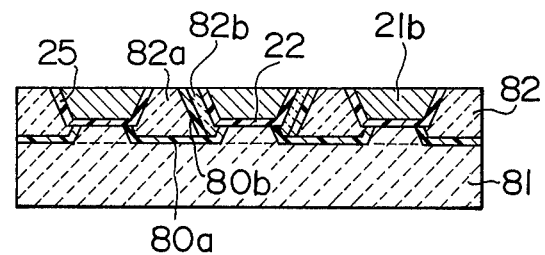

In the embodiment of FIG. 8, as is shown in the embodiment of FIG. 4, between the adjacent monocrystalline semiconductor regions there is provided a dielectric insulating film 80a which projects from the marginal portion of the non-exposed major surface of the other side of the monocrystalline semiconductor region 21b to a polycrystalline semiconductor region 81. Further, as is shown in the embodiment of FIG. 6, a dielectric insulating film 80b is provided which extends from the marginal portion of the non-exposed major surface on the other side of the monocrystalline semiconductor region to the exposed surface thereof so as to circumferentially surround the monocrystalline semiconductor region 21b. The dielectric insulating film 80b divides the floating polycrystalline semiconductor region into two regions 82a, 82b.

Figure 9:
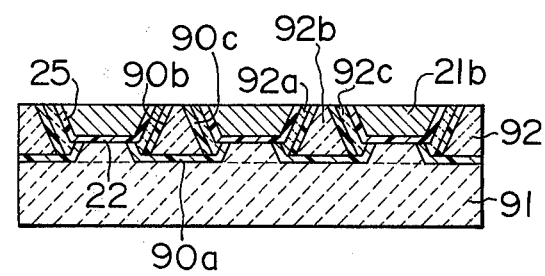

In the embodiment shown in FIG. 9, the embodiment of FIG. 8 is further developed: all the monocrystalline semiconductor regions 21b are provided at their circumference with a dielectric insulating film 90b, which divides into three regions 92a, 92b, 92c the polycrystalline semiconductor region 92 electrically isolated from the polycrystalline semiconductor region 91 by a dielectric insulating film 90a, as shown in FIG. 4, and provided between the adjacent monocrystalline semiconductor regions 21b.

In each of the above embodiments, the dielectric insulating film has been described by way of the silicon oxide coating, but without any restriction thereto other dielectric insulating coatings such as doped oxides or the like may be used with similar results.

Further, various modifications have been shown with respect to the structure of the floated polycrystalline semiconductor region, but it will be understood with ease that any structure will be allowable if the floating polycrystalline semiconductor region is provided between the adjacent monocrystalline semiconductor functional regions in such a way as to be electrically isolated from the polycrystalline semiconductor substrate region.

What is claimed is:

1. A semiconductor device comprising, in combination:
   a polycrystalline semiconductor substrate; and
   a first dielectric insulating layer selectively disposed on a plurality of portions of a first surface of said substrate;
   a plurality of functional monocrystalline semiconductor regions respectively disposed on said selectively disposed first dielectric insulating layer so as to be insulated from the respective portions of said first surface of said substrate; and wherein
   each monocrystalline semiconductor region is electrically isolated from adjacent monocrystalline semiconductor regions by a polycrystalline semiconductor region therebetween, which polycrystalline semiconductor region is electrically isolated from both said monocrystalline regions and said substrate; and wherein
   the angle formed by the side portions of a monocrystalline region and the first dielectric insulating layer on which said monocrystalline region is disposed is an obtuse angle.

2. A semiconductor device according to claim 1, wherein said polycrystalline semiconductor region is electrically isolated from said monocrystalline region by a second dielectric layer disposed therebetween and contiguous with said first dielectric layer.

3. A semiconductor device according to claim 2, wherein said polycrystalline semiconductor region is electrically isolated from said substrate by a third dielectric layer disposed therebetween and contiguous with said second dielectric layer.

4. A semiconductor device according to claim 3, wherein said first and third dielectric layers are substantially coplanar.

5. A semiconductor device according to claim 2, wherein said polycrystalline semiconductor region is electrically isolated from said substrate by a third dielectric layer disposed therebetween and contiguous with said first dielectric layer.

6. A semiconductor device according to claim 5, wherein said polycrystalline semiconductor substrate extends between said monocrystalline regions and further including a fourth dielectric layer contiguous with the side surfaces of selected ones of said monocrystalline regions and electrically isolating said substrate from the side surfaces of said selected ones of said monocrystalline regions.

7. A semiconductor device according to claim 5, wherein said polycrystalline semiconductor substrate extends between said monocrystalline regions and wherein the side surfaces of each of said monocrystalline regions are surrounded by a polycrystalline semiconductor region.

8. A semiconductor device according to claim 5, wherein each monocrystalline semiconductor region is further electrically isolated from adjacent monocrystalline semiconductor regions by a further polycrystalline semiconductor region therebetween, which further polycrystalline semiconductor region is electrically isolated from said monocrystalline regions, said substrate and the first mentioned polycrystalline semiconductor region.

9. A semiconductor device according to claim 8, wherein each monocrystalline semiconductor region is additionally electrically isolated from adjacent monocrystalline semiconductor regions by an additional polycrystalline semiconductor region therebetween, which additional polycrystalline semiconductor region is electrically isolated from said monocrystalline regions, said substrate, said first mentioned polycrystalline semiconductor region and said further polycrystalline semiconductor region.

10. A semiconductor device according to claim 2, wherein the thickness of said polycrystalline semiconductor region is greater than the thickness of a monocrystalline semiconductor region.

11. A semiconductor device according to claim 10, wherein said polycrystalline semiconductor region is electrically isolated from said substrate by a third dielectric layer disposed therebetween and contiguous with said first dielectric layer.

12. A semiconductor device according to claim 11, wherein the thickness of said polycrystalline semiconductor region is greater than the thickness of said substrate.

13. A semiconductor device comprising, in combination:
   a polycrystalline semiconductor substrate; and
   a first dielectric insulating layer selectively disposed on a plurality of portions of a first surface of said substrate;
   a plurality of functional monocrystalline semiconductor regions respectively disposed on said selectively disposed first dielectric insulating layer so as to be insulated from the respective portions of said first surface of said substrate; and wherein
   each monocrystalline semiconductor region is electrically isolated from adjacent monocrystalline semiconductor regions by a polycrystalline semiconductor region therebetween, which polycrystalline semiconductor region is electrically isolated from said monocrystalline regions and is electrically isolated from said substrate by a second dielectric layer disposed therebetween, contiguous with said first dielectric layer and extending to a second surface of said substrate, opposite said first surface thereof.

14. A semiconductor device comprising, in combination:
   a polycrystalline semiconductor substrate; and
   a first dielectric insulating layer selectively disposed on a plurality of portions of a first surface of said substrate;
   a plurality of functional monocrystalline semiconductor regions respectively disposed on said selectively disposed first dielectric insulating layer so as to be insulated from the respective portions of said first surface of said substrate; and wherein
   each monocrystalline semiconductor region is electrically isolated from adjacent monocrystalline semiconductor regions by a polycrystalline semiconductor region therebetween which polycrystalline semiconductor region is electrically isolated from said monocrystalline semiconductor regions by a second dielectric layer circumferentially surrounding and contiguous to the side surfaces of each monocrystalline region and is electrically isolated from said substrate by a third dielectric layer disposed therebetween and contiguous to said first dielectric layer, so that said polycrystalline semiconductor region is electrically floating relative to said substrate and said monocrystalline regions, and wherein said polycrystalline semiconductor region is comprised of a plurality of polycrystalline semiconductor region portions surrounding respective monocrystalline regions and electrically isolated from each other by respective dielectric layers therebetween, which respective dielectric layers extend from said third layer to the external surface of said polycrystalline region.

* * * * *